US010291211B2

(12) United States Patent
Song et al.

(10) Patent No.: US 10,291,211 B2
(45) Date of Patent: May 14, 2019

(54) ADAPTIVE PULSE GENERATION CIRCUITS FOR CLOCKING PULSE LATCHES WITH MINIMUM HOLD TIME

(71) Applicants: Qualcomm Technologies, Inc., San Diego, CA (US); Yonsei University, University-Industry Foundation, Seoul (KR)

(72) Inventors: Stanley Seungchul Song, San Diego, CA (US); Seong-Ook Jung, Seoul (KR); Hanwool Jeong, Seoul (KR); Tae Woo Oh, Seoul (KR); Giridhar Nallapati, San Diego, CA (US); Periannan Chidambaram, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/259,633

(22) Filed: Sep. 8, 2016

(65) Prior Publication Data
US 2018/0069535 A1     Mar. 8, 2018

(51) Int. Cl.
*H03L 7/06*       (2006.01)
*H03K 3/356*     (2006.01)
(Continued)

(52) U.S. Cl.
CPC ....... *H03K 3/356104* (2013.01); *H03K 3/012* (2013.01); *H03K 3/017* (2013.01);
(Continued)

(58) Field of Classification Search
CPC ........... H03K 3/356104; H03K 3/0375; H03K 3/017; H03K 19/0963; H03K 3/037; H03K 3/012
(Continued)

(56) References Cited

U.S. PATENT DOCUMENTS 6,700,944 B1   3/2004   Chlipala et al.
7,068,565 B2   6/2006   Sasagawa
(Continued)

FOREIGN PATENT DOCUMENTS

JP      H11340795 A      12/1999

OTHER PUBLICATIONS

International Search Report and Written Opinion for PCT/US2017/046411, dated Nov. 29, 2017, 18 pages.
(Continued)

*Primary Examiner* — Metasebia T Retebo
(74) *Attorney, Agent, or Firm* — Withrow & Terranova, PLLC

(57) ABSTRACT

Adaptive pulse generation circuits for clocking pulse latches with minimum hold time are provided. In one aspect, an adaptive pulse generation circuit employs a dynamic XOR-based logic gate configured to provide a pulse generation signal based on an XOR-based function of data input and data output-based signals of a pulse latch. A pull-down keeper circuit is configured to pull the pulse generation signal to a ground voltage in response to the pulse generation signal being in an inactive state while the clock signal is in an active state. A logic circuit is configured to generate an adaptive pulse signal to clock a pulse latch in response to the pulse generation signal and the clock signal being in an active state. This configuration results in the pulse width of the adaptive pulse signal corresponding to the input-to-output delay of the pulse latch.

16 Claims, 7 Drawing Sheets

(51) Int. Cl.
*H03K 19/096* (2006.01)
*H03K 3/037* (2006.01)
*H03K 3/012* (2006.01)
*H03K 3/017* (2006.01)

(52) U.S. Cl.
CPC .......... *H03K 3/037* (2013.01); *H03K 3/0375* (2013.01); *H03K 19/0963* (2013.01)

(58) Field of Classification Search
USPC ........................................................ 327/211
See application file for complete search history.

(56) References Cited

U.S. PATENT DOCUMENTS

| | | | |
|---|---|---|---|
| 7,443,218 | B2 | 10/2008 | Onouchi et al. |
| 8,120,406 | B2 | 2/2012 | Iyer et al. |
| 9,094,002 | B2 | 7/2015 | Chiou et al. |
| 2007/0001734 | A1* | 1/2007 | Onouchi ................ H03K 3/012 327/218 |
| 2014/0266364 | A1 | 9/2014 | Singh et al. |

OTHER PUBLICATIONS

Second Written Opinion for PCT/US2017/046411, dated Aug. 6, 2018, 13 pages.
International Preliminary Report on Patentability for PCT/US2017/046411, dated Dec. 13, 2018, 14 pages.

* cited by examiner

ADAPTIVE PULSE GENERATION CIRCUITS FOR CLOCKING PULSE LATCHES WITH MINIMUM HOLD TIME

BACKGROUND

I. Field of the Disclosure

The technology of the disclosure relates generally to pulse signal generation, and particularly to generating pulse signals for pulse latches with minimum hold time.

II. Background

Digital logic circuits include devices for storing state information of data bits at various points in corresponding data paths. Different types of devices for storing state information exist, each possessing certain unique features. For example, master-slave flip-flops (MSFFs) are conventional devices employed to store state information of data bits in a digital logic circuit. MSFFs are two-stage devices configured to stabilize state information of a data bit for a particular setup time prior to an active transition of a clock signal, and provide the state information in response to a clock signal transitioning to an active state. The setup time of an MSFF may limit the performance of delay-sensitive digital logic circuits. In this manner, other devices having no setup time can be employed to avoid the performance limitations attributable to the setup time of MSFFs. For example, pulse latches are devices that store state information of data bits without a setup time. More specifically, pulse latches are devices configured to transfer state information of a data bit from an input to a storage element and an output in response to an active transition of a clock signal without the need for a setup time to stabilize the input signal.

In this regard, FIG. 1 illustrates a conventional pulse latch 100 that is clocked by a conventional pulse generation circuit 102. The conventional pulse latch 100 is configured to store state information of an input signal 104 and provide the stored state information via an output signal 106 in response to a pulse signal PULSE. For example, the input signal 104 is provided to an inverter 108, which provides an inverted input signal 110 to a transmission gate 112. In response to the pulse signal PULSE being in an active state (and an inverted pulse signal PULSE_B being in an inactive state), the transmission gate 112 provides the inverted input signal 110 to cross-coupled inverters 114, 116 and an inverter 118. Additionally, the pulse signal PULSE being in an active state deactivates a transmission gate 120, which disconnects the cross-coupled inverters 114, 116. In this manner, the inverted input signal 110 is reflected through the transmission gate 112, while the inverter 118 provides the state information via the output signal 106. In response to the pulse signal PULSE being in an inactive state, the transmission gate 120 is activated and couples an output of the cross-coupled inverter 116 to the inverter 118, thus causing the state information to be held on the output signal 106 while the conventional pulse latch 100 is not being clocked by the pulse signal PULSE. The pulse signal PULSE is generated by the conventional pulse generation circuit 102 in response to a clock signal CLK transitioning to an active state. In this manner, because the state information is provided to the cross-coupled inverters 114, 116 and to the inverter 118 in response to an active transition of the clock signal CLK, the conventional pulse latch 100 does not incur a setup time to stabilize the input signal 104 prior to transferring the state information for storage.

Although the pulse latch 100 does not incur a setup time, storing the state information in the pulse latch 100 requires the input signal 104 to remain stable for a particular hold time while the state information is provided to the cross-coupled inverters 114, 116 and the inverter 118. However, the hold time needed for stability may vary based on process, voltage, and temperature (PVT) variations of elements in the pulse latch 100. Further, as a supply voltage used to drive the elements of the pulse latch 100 decreases to reduce power consumption, the effect of PVT variations on elements of the pulse latch 100 increases, which causes the hold time needed for the pulse latch 100 to vary. For example, if the supply voltage is decreased to a near threshold voltage (NTV), the hold time of the pulse latch 100 can vary in response to PVT variations present during a particular operation. In order to account for such hold time variations, the number N of inverters 122(1)-122(N) (N being any odd integer) employed in the pulse generation circuit 102 are increased to provide the pulse signal PULSE with a pulse width corresponding to a worst-case hold time of the pulse latch 100 to account for the PVT variations. However, increasing the number N of the inverters 122(1)-122(N) increases the hold time, thus reducing the performance of the pulse latch 100.

SUMMARY OF THE DISCLOSURE

Aspects disclosed herein include adaptive pulse generation circuits for clocking pulse latches with minimum hold time. In one aspect, an adaptive pulse generation circuit employs a dynamic XOR-based logic gate configured to provide a pulse generation signal based on an XOR-based function of data input and data output-based signals of a pulse latch. The adaptive pulse generation circuit also employs a pull-down keeper circuit configured to pull the pulse generation signal to a ground voltage in response to the pulse generation signal being in an inactive state while the clock signal is in an active state. Pulling down the pulse generation signal in this manner prevents glitches from the data input and data output-based signals from affecting the pulse generation signal. The adaptive pulse generation circuit also employs a logic circuit configured to generate an adaptive pulse signal used to clock the pulse latch in response to the pulse generation signal and the clock signal being in an active state. In this manner, the adaptive pulse generation circuit causes an active transition of the adaptive pulse signal in response to the input data and output data-based signals being in different states following an active transition of the clock signal. However, in response to the input data and output data-based signals being in the same state, the adaptive pulse signal transitions to an inactive state. This configuration results in the pulse width of the adaptive pulse signal corresponding to an input-to-output delay of the pulse latch such that a hold time associated with the adaptive pulse signal is adaptive to the needs of the pulse latch according to process, voltage, and temperature (PVT) variations. By generating the adaptive pulse signal based on the input-to-output delay of the pulse latch instead of providing a static pulse signal according to the worst-case hold time, the adaptive pulse generation circuit minimizes the hold time of the pulse latch even at near threshold voltage (NTV) supply voltages.

In this regard in one aspect, an adaptive pulse generation circuit for generating an adaptive pulse signal for a pulse latch is provided. The adaptive pulse generation circuit comprises a dynamic XOR-based logic gate. The dynamic XOR-based logic gate comprises a clock input configured to receive a clock signal. The dynamic XOR-based logic gate also comprises a first input configured to receive a data input signal of the pulse latch. The dynamic XOR-based logic gate also comprises a second input configured to receive a data output-based signal of the pulse latch. The dynamic XOR-based logic gate also comprises an output. The output is configured to provide a pulse generation signal in an active state in response to the clock signal being in an inactive state, and provide the pulse generation signal in a state according to an XOR-based function of the data input signal and the data output-based signal in response to the clock signal being in an active state. The adaptive pulse generation circuit also comprises a pull-down keeper circuit configured to pull the pulse generation signal to a ground voltage in response to the pulse generation signal being in an inactive state and the clock signal being in the active state. The adaptive pulse generation circuit also comprises a logic circuit configured to generate the adaptive pulse signal having a pulse width corresponding to an input-to-output delay of the pulse latch in response to the pulse generation signal and the clock signal being in the active state.

In another aspect, an adaptive pulse generation circuit for generating an adaptive pulse signal for a pulse latch is provided. The adaptive pulse generation circuit comprises a means for receiving a clock signal. The adaptive pulse generation circuit also comprises a means for receiving a data input signal of the pulse latch. The adaptive pulse generation circuit also comprises a means for receiving a data output-based signal of the pulse latch. The adaptive pulse generation circuit also comprises a means for providing a pulse generation signal in an active state in response to the clock signal being in an inactive state. The adaptive pulse generation circuit also comprises a means for providing the pulse generation signal in a state according to an XOR-based function of the data input signal and the data output-based signal in response to the clock signal being in an active state. The adaptive pulse generation circuit also comprises a means for pulling the pulse generation signal to a ground voltage in response to the pulse generation signal being in an inactive state and the clock signal being in the active state. The adaptive pulse generation circuit also comprises a means for generating the adaptive pulse signal having a pulse width corresponding to an input-to-output delay of the pulse latch in response to the pulse generation signal and the clock signal being in the active state.

In another aspect, a method for generating an adaptive pulse signal for a pulse latch is provided. The method comprises receiving a clock signal. The method also comprises receiving a data input signal of the pulse latch. The method also comprises receiving a data output-based signal of the pulse latch. The method also comprises providing a pulse generation signal in an active state in response to the clock signal being in an inactive state. The method also comprises providing the pulse generation signal in a state according to an XOR-based function of the data input signal and the data output-based signal in response to the clock signal being in an active state. The method also comprises pulling the pulse generation signal to a ground voltage in response to the pulse generation signal being in an inactive state and the clock signal being in the active state. The method also comprises generating the adaptive pulse signal having a pulse width corresponding to an input-to-output delay of the pulse latch in response to the pulse generation signal and the clock signal being in the active state.

In another aspect, a digital logic circuit is provided. The digital logic circuit comprises a plurality of pulse latches. Each pulse latch of the plurality of pulse latches comprises a data input configured to receive a data input signal. Each pulse latch of the plurality of pulse latches also comprises a pulse input configured to receive a corresponding adaptive pulse signal. Each pulse latch of the plurality of pulse latches also comprises a data pulse output configured to provide a data output-based signal. The digital logic circuit also comprises a plurality of adaptive pulse generation circuits. Each adaptive pulse generation circuit of the plurality of adaptive pulse generation circuits corresponds to a pulse latch of the plurality of pulse latches. Each adaptive pulse generation circuit of the plurality of adaptive pulse generation circuits comprises a dynamic XOR-based logic gate. The dynamic XOR-based logic gate comprises a clock input configured to receive a clock signal. The dynamic XOR-based logic gate also comprises a first input configured to receive the data input signal of the corresponding pulse latch. The dynamic XOR-based logic gate also comprises a second input configured to receive the data output-based signal of the corresponding pulse latch. The dynamic XOR-based logic gate also comprises an output. The output is configured to provide a pulse generation signal in an active state in response to the clock signal being in an inactive state, and provide the pulse generation signal in a state according to an XOR-based function of the data input signal and the data output-based signal in response to the clock signal being in an active state. Each adaptive pulse generation circuit of the plurality of adaptive pulse generation circuits also comprises a pull-down keeper circuit configured to pull the pulse generation signal to a ground voltage in response to the pulse generation signal being in an inactive state and the clock signal being in the active state. Each adaptive pulse generation circuit of the plurality of adaptive pulse generation circuits also comprises a logic circuit configured to generate the corresponding adaptive pulse signal having a pulse width corresponding to an input-to-output delay of the corresponding pulse latch in response to the pulse generation signal and the clock signal being in the active state.

DETAILED DESCRIPTION

Figure 1:
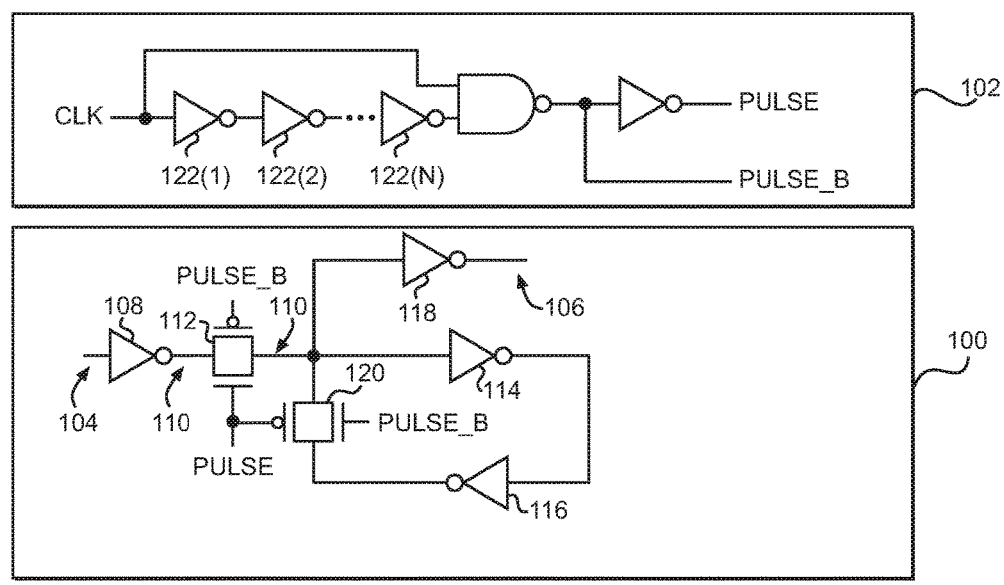
FIG. 1 is a circuit diagram of a conventional pulse latch that is clocked by a conventional pulse generation circuit employing multiple inverters to generate a pulse signal having a pulse width corresponding to a worst-case hold time of the conventional pulse latch.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include adaptive pulse generation circuits for clocking pulse latches with minimum hold time. In one aspect, an adaptive pulse generation circuit employs a dynamic XOR-based logic gate configured to provide a pulse generation signal based on an XOR-based function of data input and data output-based signals of a pulse latch. The adaptive pulse generation circuit also employs a pull-down keeper circuit configured to pull the pulse generation signal to a ground voltage in response to the pulse generation signal being in an inactive state while the clock signal is in an active state. Pulling down the pulse generation signal in this manner prevents glitches from the data input and data output-based signals from affecting the pulse generation signal. The adaptive pulse generation circuit also employs a logic circuit configured to generate an adaptive pulse signal used to clock the pulse latch in response to the pulse generation signal and the clock signal being in an active state. In this manner, the adaptive pulse generation circuit causes an active transition of the adaptive pulse signal in response to the input data and output data-based signals being in different states following an active transition of the clock signal. However, in response to the input data and output data-based signals being in the same state, the adaptive pulse signal transitions to an inactive state. This configuration results in the pulse width of the adaptive pulse signal corresponding to an input-to-output delay of the pulse latch such that a hold time associated with the adaptive pulse signal is adaptive to the needs of the pulse latch according to process, voltage, and temperature (PVT) variations. By generating the adaptive pulse signal based on the input-to-output delay of the pulse latch instead of providing a static pulse signal according to the worst-case hold time, the adaptive pulse generation circuit minimizes the hold time of the pulse latch even at near threshold voltage (NTV) supply voltages.

Figure 2:
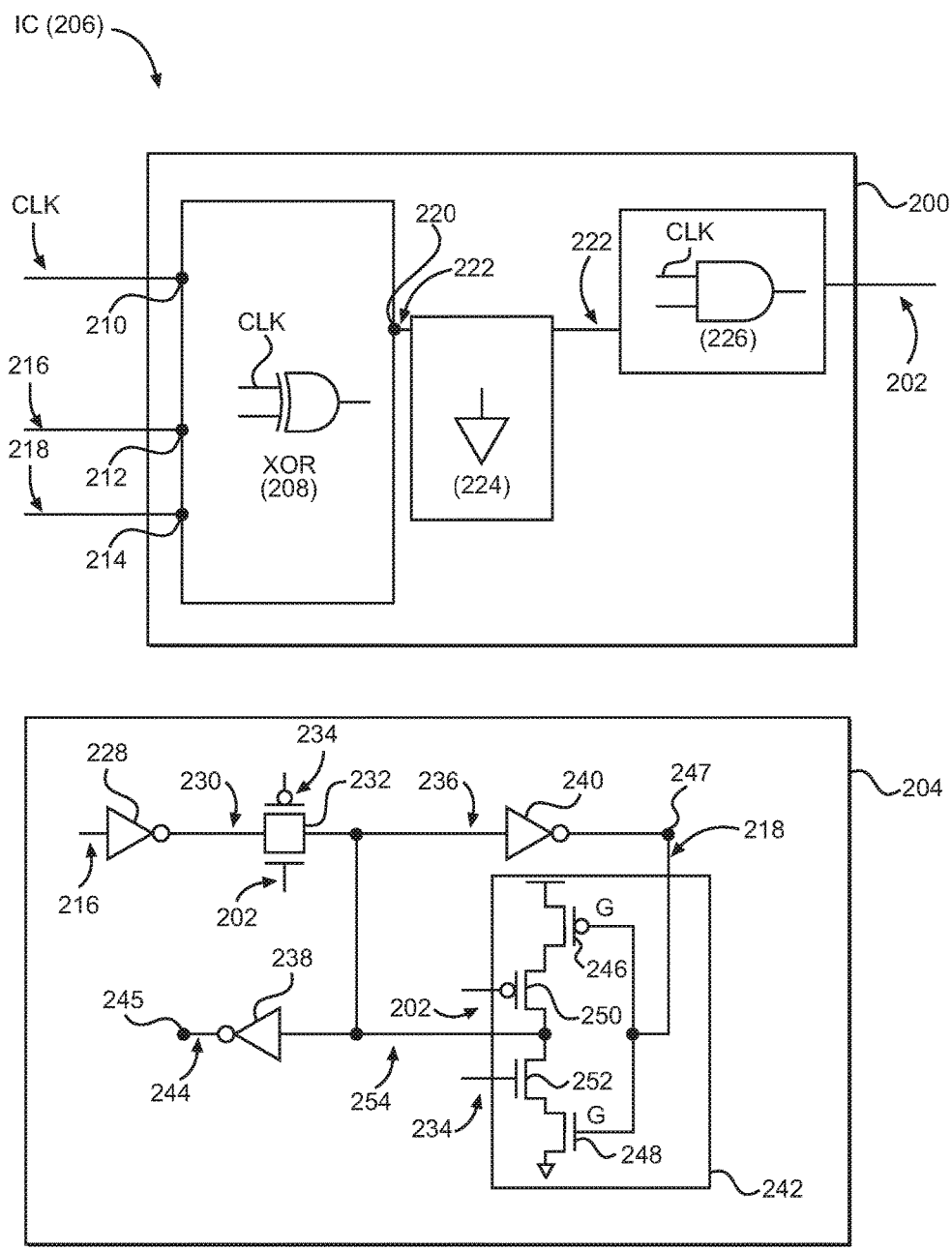
FIG. 2 is a block diagram of an exemplary adaptive pulse generation circuit configured to generate an adaptive pulse signal having a pulse width corresponding to an input-to-output delay of an exemplary pulse latch.

In this regard, FIG. 2 is a block diagram of an exemplary adaptive pulse generation circuit 200 configured to generate an adaptive pulse signal 202 having a pulse width corresponding to an input-to-output delay of an exemplary pulse latch 204. As a non-limiting example, the adaptive pulse generation circuit 200 can be implemented in an integrated circuit (IC) 206. The adaptive pulse generation circuit 200 employs a dynamic XOR-based logic gate 208 that employs a clock input 210 configured to receive a clock signal CLK, and first and second inputs 212, 214 configured to receive a data input signal 216 and a data output-based signal 218, respectively, of the pulse latch 204. The dynamic XOR-based logic gate 208 also employs an output 220 configured to provide a pulse generation signal 222 in an active state in response to the clock signal CLK being in an inactive state. Additionally, the output 220 is configured to provide the pulse generation signal 222 in a state according to an XOR-based function of the data input and data output-based signals 216, 218 in response to the clock signal CLK being in an active state. In this manner, the dynamic XOR-based logic gate 208 is configured to provide the pulse generation signal 222 according to an XOR-based function of the data input and data output-based signals 216, 218.

With continuing reference to FIG. 2, the adaptive pulse generation circuit 200 also employs a pull-down keeper circuit 224 configured to pull the pulse generation signal 222 to a ground voltage in response to the pulse generation signal 222 being in an inactive state while the clock signal CLK is in an active state. As described in more detail below, pulling the pulse generation signal 222 to a ground voltage in this manner stabilizes the pulse generation signal 222 so that changes in the data input and data output-based signals 216, 218 do not interfere with the adaptive pulse signal 202 while the pulse latch 204 is being clocked (e.g., pulsed). Additionally, the adaptive pulse generation circuit 200 employs a logic circuit 226 configured to generate the adaptive pulse signal 202 used to clock the pulse latch 204 in response to the pulse generation signal 222 and the clock signal CLK both being in an active state.

In this manner, the adaptive pulse generation circuit 200 causes an active transition of the adaptive pulse signal 202 in response to the data input and data output-based signals 216, 218 being in different states while the clock signal CLK is in an active state. However, in response to the data input and data output-based signals 216, 218 being in the same state while the clock signal CLK is in an active state, the adaptive pulse signal 202 transitions to an inactive state. This configuration results in the pulse width of the adaptive pulse signal 202 corresponding to an input-to-output delay of the pulse latch 204 such that a hold time associated with the adaptive pulse signal 202 is adaptive to the needs of the pulse latch 204 based on current PVT variations. By generating the adaptive pulse signal 202 based on the current operating conditions of the pulse latch 204 instead of providing a static pulse signal according to the worst-case hold time corresponding to the worst-case PVT variations, the adaptive pulse generation circuit 200 minimizes the hold time of the pulse latch 204, even at NTV supply voltages.

With continuing reference to FIG. 2, as a non-limiting example, the adaptive pulse signal 202 is used to clock the pulse latch 204. In this example, the pulse latch 204 employs an inverter 228 configured to receive the data input signal 216 and provide an inverted data input signal 230 to a transmission gate 232. The adaptive pulse signal 202 and an inverted adaptive pulse signal 234 are provided to the transmission gate 232, which provides an inverted data output signal 236 in response to the adaptive pulse signal 202 being in an active state. The inverted data output signal 236 is provided to an inverter 238 and cross-coupled inverters 240, 242. The inverter 238 is configured to provide a data output signal 244 as the output data of the pulse latch 204. In this aspect, the data output signal 244 has the same state as the data output-based signal 218. In this manner, the data output-based signal 218 is provided to the dynamic XOR-based logic gate 208 instead of the data output signal 244 so as to reduce a load placed on the inverter 238. In other words, the data output signal 244 is provided from a data output 245 of the pulse latch 204 that corresponds to the inverter 238. However, the data output-based signal 218 is provided from a data pulse output 247 of the pulse latch 204 different from the data output 245. Providing the data output-based signal 218 from the data pulse output 247 (i.e., the cross-coupled inverter 240) to the adaptive pulse generation circuit 200 results in the load on the data output 245 (i.e., the inverter 238) being reduced compared to providing the data output signal 244 to the adaptive pulse generation circuit 200. Other aspects may provide the data output signal 244 to the adaptive pulse generation circuit 200 instead of the data output-based signal 218 and achieve similar functionality.

With continuing reference to FIG. 2, the cross-coupled inverter 240 provides the data output-based signal 218 to the cross-coupled inverter 242 such that the cross-coupled inverters 240, 242 store state information of the data output-based signal 218. The cross-coupled inverter 242 in this aspect employs a p-type metal oxide semiconductor (MOS) (PMOS) transistor 246 and an n-type MOS (NMOS) transistor 248 having gates (G) configured to receive the data output-based signal 218 from the cross-coupled inverter 240. The cross-coupled inverter 242 also includes a PMOS transistor 250 and an NMOS transistor 252 configured to provide an inverted data output-based signal 254 from the cross-coupled inverter 242 to the inverter 238 in response to the adaptive pulse signal 202 and the inverted adaptive pulse signal 234 being in an inactive and active state, respectively. Using the adaptive pulse signal 202 to clock the pulse latch 204 minimizes the hold time of the pulse latch 204, even at NTV supply voltages.

To facilitate further explanation of the aspect described above, FIG. 3 provides an exemplary timing diagram 300 illustrating exemplary timing of signals generated by the adaptive pulse generation circuit 200 in FIG. 2 in response to the data input and data output-based signals 216, 218 and the clock signal CLK. In this example, the active state is equivalent to a logic high '1' state, and the inactive state is equivalent to a logic low '0' state. Additionally, in this example, the data output signal 244 is assumed to have the same state as the data output-based signal 218.

Figure 3:
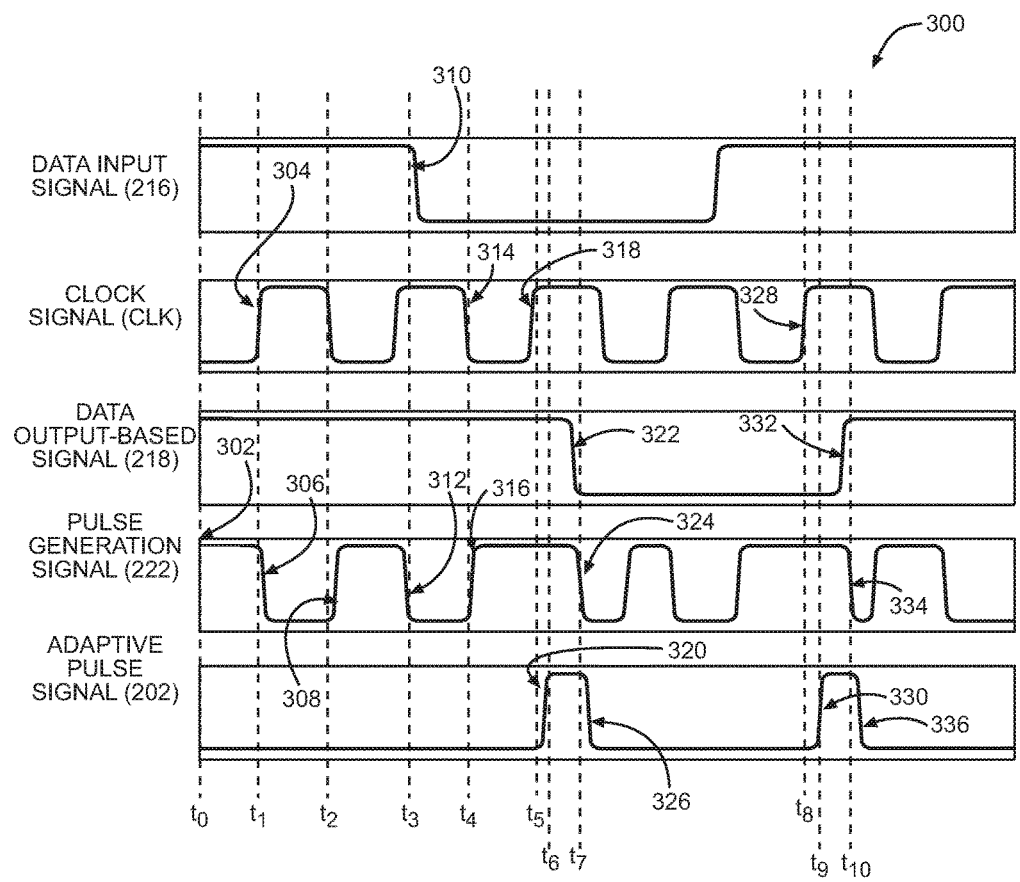
FIG. 3 is an exemplary timing diagram illustrating exemplary timing of signals generated by the adaptive pulse generation circuit in FIG. 2 in response to a data input signal and a data output-based signal of the pulse latch, and a clock signal.

With continuing reference to FIG. 3, at time $t_0$, the clock signal CLK is in an inactive state, resulting in the output 220 of the dynamic XOR-based logic gate 208 providing the pulse generation signal 222 in an active state (arrow 302). Further, at time $t_0$ the data input signal 216 and the data output-based signal 218 are both in an active state. In this manner, the adaptive pulse signal 202 is in an inactive state at time $t_0$ such that the pulse latch 204 is not clocked at time $t_0$. At time $t_1$, the clock signal CLK transitions to an active state (arrow 304), while the data input and data output-based signals 216, 218 remain in an active state. In response to the clock signal CLK and the data input and data output-based signals 216, 218 being in an active state at time $t_1$, the pulse generation signal 222 is pulled to an inactive state (arrow 306). The inactive state of the pulse generation signal 222 in conjunction with the active state of the clock signal CLK triggers the pull-down keeper circuit 224 to pull the pulse generation signal 222 to the ground voltage. At time $t_2$, the clock signal CLK transitions to an inactive state, which causes the pulse generation signal 222 to transition to the active state (arrow 308).

With continuing reference to FIG. 3, at time $t_3$, the data input signal 216 transitions to an inactive state (arrow 310) while the data output-based signal 218 remains in an active state. However, at time $t_3$, the pulse generation signal 222 is being pulled to an inactive state (arrow 312) in response to the clock signal CLK being in an active state. Thus, the adaptive pulse signal 202 remains in an inactive state even though the data input and data output-based signals 216, 218 are in different states. In particular, the dynamic properties of the dynamic XOR-based logic gate 208 only allows the pulse generation signal 222 to change while the clock signal CLK is in an active state. Additionally, at time $t_4$, the clock signal CLK transitions to an inactive state (arrow 314), which causes the pulse generation signal 222 to transition to an active state (arrow 316). At time $t_5$, the clock signal CLK transitions to an active state (arrow 318) while the data input and data output-based signals 216, 218 remain in different states. In response to the active transition of the clock signal CLK at arrow 318 in conjunction with the data input and data output-based signals 216, 218 being in an inactive state and an active state, respectively, the pulse generation signal 222 remains in an active state.

With continuing reference to FIG. 3, in response to the pulse generation signal 222 being in an active state in conjunction with an active transition of the clock signal CLK, the adaptive pulse signal 202 transitions to an active state at time $t_6$ (arrow 320). In this manner, the different states of the data input and data output-based signals 216, 218 indicate that updated state information on the data input signal 216 needs to be stored and provided as the data output signal 244 of the pulse latch 204. Thus, in response to the active transition of the clock signal CLK at arrow 318 and the pulse generation signal 222 being in an active state, the adaptive pulse signal 202 clocks the pulse latch 204. The data output-based signal 218 transitions to an inactive state (arrow 322), signifying that the inactive state of the data input signal 216 has been transferred to the data output signal 244. In response to the inactive transition of the data output-based signal 218 at arrow 322, the pulse generation signal 222 transitions to an inactive state at time $t_7$ (arrow 324). In response to the pulse generation signal 222 transitioning to an inactive state at time $t_7$, the adaptive pulse signal 202 transitions to an inactive state (arrow 326). In this manner, the adaptive pulse generation circuit 200 generates the adaptive pulse signal 202 to have a pulse width corresponding to the input-to-output delay of the pulse latch 204 such that the adaptive pulse signal 202 minimizes the hold time of the pulse latch 204.

With continuing reference to FIG. 3, another exemplary timing of signals generated by the adaptive pulse generation circuit 200 in FIG. 2 is now described for additional clarification. In this example, the clock signal CLK transitions to an active state at time $t_8$ (arrow 328) while the data input signal 216 and the data output-based signal 218 are in different states. In response to the active transition of the clock signal CLK at arrow 328, in conjunction with the data input and data output-based signals 216, 218 being in an active state and an inactive state, respectively, the pulse generation signal 222 remains in an active state. In response to the pulse generation signal 222 being in an active state in conjunction with an active transition of the clock signal CLK, the adaptive pulse signal 202 transitions to an active state at time $t_9$ (arrow 330). Thus, in response to the active transition of the clock signal CLK at arrow 328 and the pulse generation signal 222 being in an active state, the adaptive pulse signal 202 clocks the pulse latch 204. The data output-based signal 218 transitions to an active state (arrow 332), signifying that the active state of the data input signal 216 has been transferred to the data output signal 244. In response to the active transition of the data output-based signal 218 at arrow 332, the pulse generation signal 222 transitions to an inactive state at time $t_{10}$ (arrow 334). In response to the pulse generation signal 222 transitioning to an inactive state at time $t_{10}$, the adaptive pulse signal 202 transitions to an inactive state (arrow 336).

Figure 4:
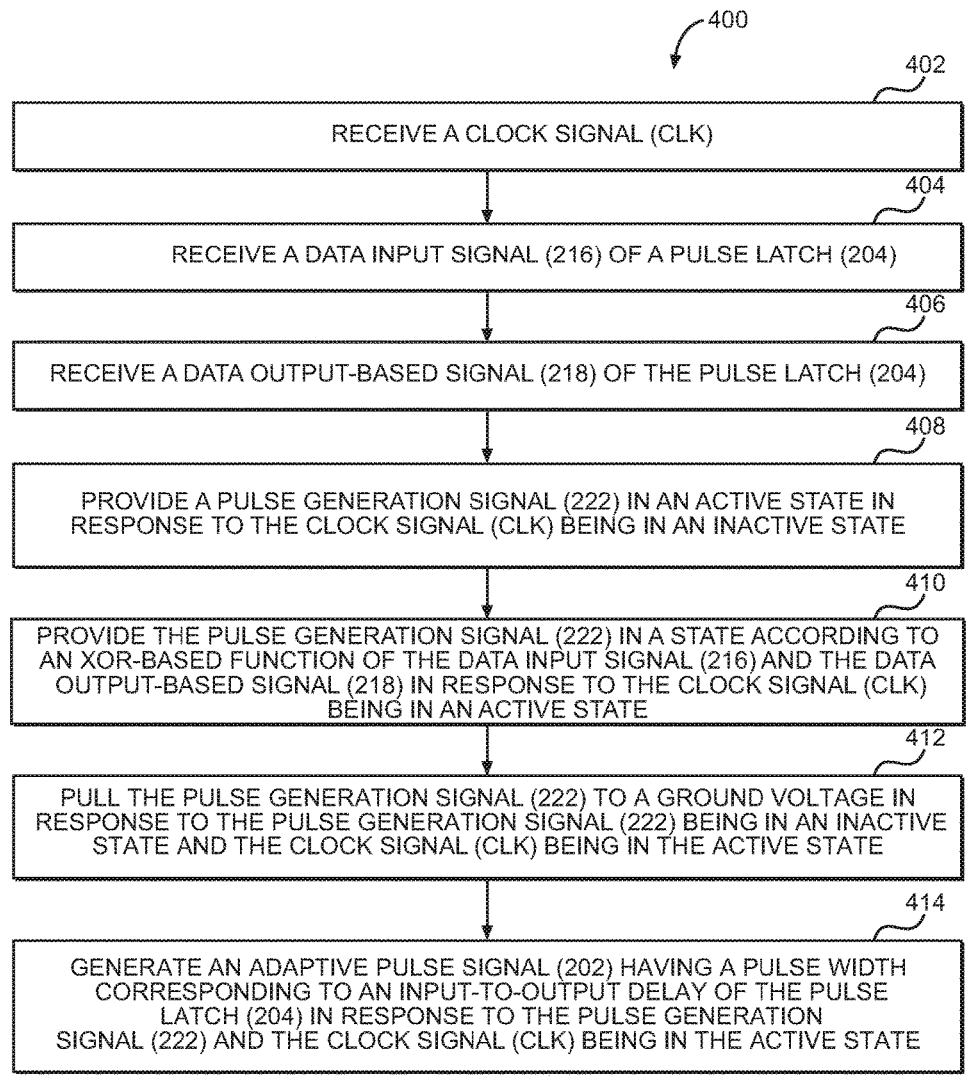
FIG. 4 is a flowchart illustrating an exemplary process employed by the adaptive pulse generation circuit in FIG. 2 to generate the adaptive pulse signal.

FIG. 4 illustrates an exemplary process 400 employed by the adaptive pulse generation circuit 200 in FIG. 2 to generate the adaptive pulse signal 202. The process 400 includes the dynamic XOR-based logic gate 208 receiving the clock signal CLK (block 402). The process 400 also includes the dynamic XOR-based logic gate 208 receiving the data input signal 216 of the pulse latch 204 (block 404). Additionally, the process 400 includes the dynamic XOR-based logic gate 208 receiving the data output-based signal 218 of the pulse latch 204 (block 406). The process 400 also includes the dynamic XOR-based logic gate 208 providing the pulse generation signal 222 in an active state in response to the clock signal CLK being in an inactive state (block 408). The process 400 also includes the dynamic XOR-based logic gate 208 providing the pulse generation signal 222 in a state according to an XOR-based function of the data input signal 216 and the data output-based signal 218 in response to the clock signal CLK being in an active state (block 410). Further, the process 400 includes the pull-down keeper circuit 224 pulling the pulse generation signal 222 to the ground voltage in response to the pulse generation signal 222 being in an inactive state and the clock signal CLK being in the active state (block 412). The process 400 also includes the logic circuit 226 generating the adaptive pulse signal 202 having a pulse width corresponding to the input-to-output delay of the pulse latch 204 in response to the pulse generation signal 222 and the clock signal CLK being in the active state (block 414).

Figure 5:
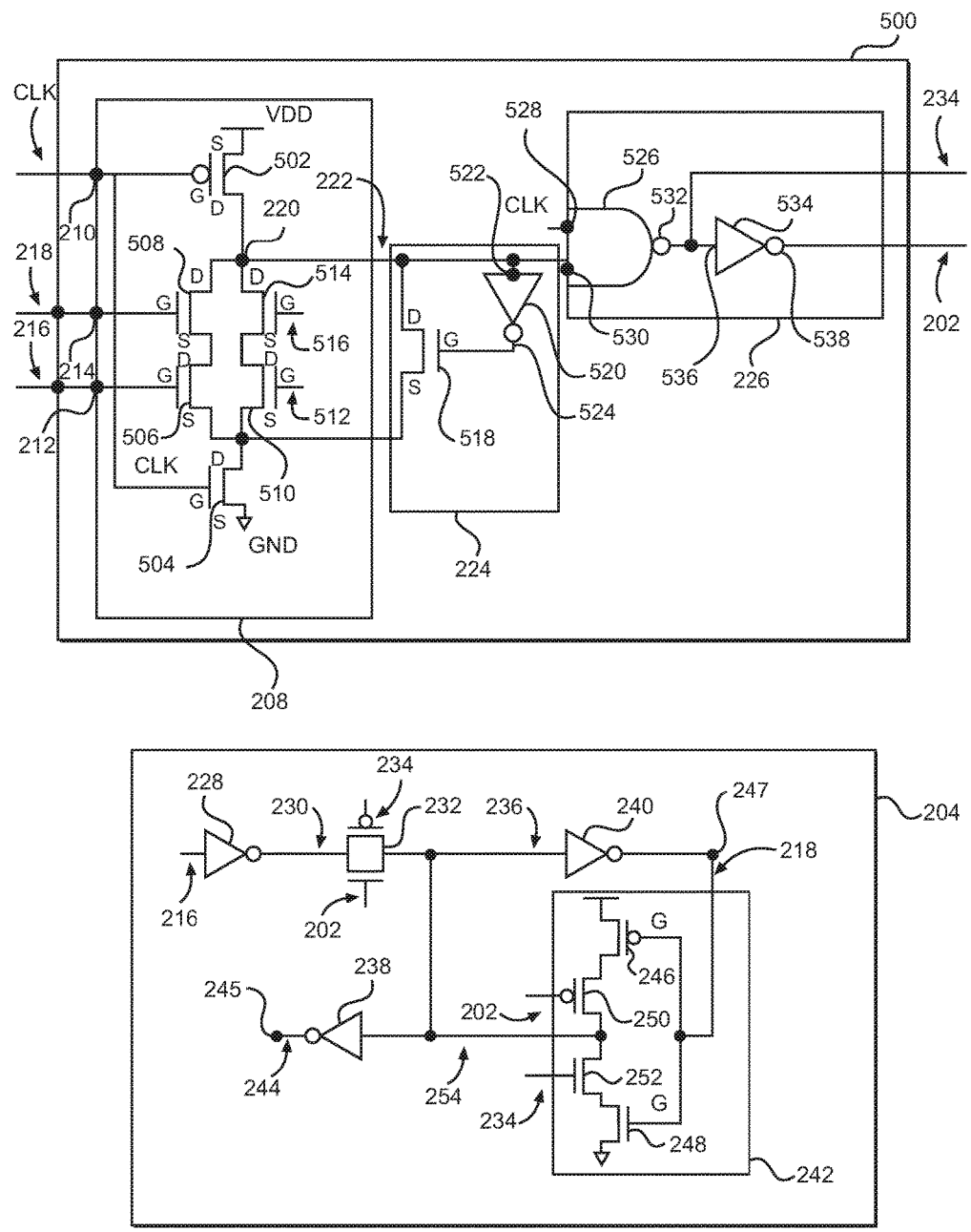
FIG. 5 is a circuit diagram of another exemplary adaptive pulse generation circuit configured to generate the adaptive pulse signal of FIG. 2 having a pulse width corresponding to the input-to-output delay of the pulse latch.

Aspects of the adaptive pulse generation circuit described herein, such as the adaptive pulse generation circuit 200 in FIG. 2, can be implemented using various circuit designs and elements. As a non-limiting example, FIG. 5 illustrates a circuit diagram of an exemplary adaptive pulse generation circuit 500 configured to generate the adaptive pulse signal 202 having a pulse width corresponding to the input-to-output delay of the pulse latch 204. The adaptive pulse generation circuit 500 includes certain common components with the adaptive pulse generation circuit 200 in FIG. 2 as shown by common element numbers between FIGS. 2 and 5, and thus will not be re-described herein.

With continuing reference to FIG. 5, the dynamic XOR-based logic gate 208 employs a first PMOS transistor 502 that includes a source (S) electrically coupled to a supply voltage source VDD, a gate (G) electrically coupled to the clock input 210 so as to receive the clock signal CLK, and a drain (D) electrically coupled to the output 220 of the dynamic XOR-based logic gate 208. The dynamic XOR-based logic gate 208 also employs a first NMOS transistor 504 that includes a source (S) electrically coupled a ground voltage source GND, a gate (G) electrically coupled to the clock input 210 so as to receive the clock signal CLK, and a drain (D). In this manner, the dynamic XOR-based logic gate 208 is configured to function as a dynamic logic gate according to the clock signal CLK. Additionally, because the dynamic XOR-based logic gate 208 includes the first PMOS transistor 502 electrically coupled to the supply voltage source VDD as described above, the dynamic XOR-based logic gate 208 is configured to pre-charge the pulse generation signal 222 to a source voltage (e.g., an active state) in response to the clock signal CLK being in an inactive state.

With continuing reference to FIG. 5, the dynamic XOR-based logic gate 208 employs a second NMOS transistor 506 that includes a source (S) electrically coupled to the drain (D) of the first NMOS transistor 504, a gate (G) electrically coupled to the first input 212 of the dynamic XOR-based logic gate 208 so as to receive the data input signal 216, and a drain (D). The dynamic XOR-based logic gate 208 also employs a third NMOS transistor 508 that includes a source (S) electrically coupled the drain (D) of the second NMOS transistor 506, a gate (G) electrically coupled to the second input 214 of the dynamic XOR-based logic gate 208 so as to receive the data output-based signal 218, and a drain (D) electrically coupled to the output 220 of the dynamic XOR-based logic gate 208. Further, the dynamic XOR-based logic gate 208 employs a fourth NMOS transistor 510 that includes a source (S) electrically coupled to the drain (D) of the first NMOS transistor 504, a gate (G) configured to receive an inverted data input signal 512, which is equivalent to a logical inverse of the data input signal 216, and a drain (D). The dynamic XOR-based logic gate 208 also employs a fifth NMOS transistor 514 that includes a source (S) electrically coupled the drain (D) of the fourth NMOS transistor 510, a gate (G) configured to receive an inverted data output-based signal 516 which is equivalent to a logical inverse of the data output-based signal 218, and a drain (D) electrically coupled to the output 220 of the dynamic XOR-based logic gate 208. In this manner, the dynamic XOR-based logic gate 208 is configured to generate the pulse generation signal 222 on the output 220 by performing an XOR-based function on the data input and data output-based signals 216, 218 in response to the clock signal CLK.

With continuing reference to FIG. 5, the pull-down keeper circuit 224 employs an NMOS transistor 518 that includes a source (S) electrically coupled to the drain (D) of the first NMOS transistor 504 in the dynamic XOR-based logic gate 208, a gate (G), and a drain (D) electrically coupled to the output 220 of the dynamic XOR-based logic gate 208. The pull-down keeper circuit 224 also employs an inverter 520 that includes an input 522 electrically coupled to the output 220, and an output 524 electrically coupled to the gate (G) of the NMOS transistor 518 of the pull-down keeper circuit 224. In this manner, the pull-down keeper circuit 224 is configured to stabilize the pulse generation signal 222 so that glitches in the data input and data output-based signals 216, 218 do not interfere with the adaptive pulse signal 202 while the pulse latch 204 is being clocked (e.g., pulsed).

With continuing reference to FIG. 5, the logic circuit 226 employs an AND-based logic gate 526 (e.g., NAND gate 526) that includes a first input 528 configured to receive the clock signal CLK, a second input 530 electrically coupled to the output 220 of the dynamic XOR-based logic gate 208, and an output 532 configured to provide the inverted adaptive pulse signal 234. In other words, the AND-based logic gate 526 in this aspect is configured to perform a NAND-based logic function on the clock signal CLK and the pulse generation signal 222. The logic circuit 226 also employs an inverter 534 that includes an input 536 electrically coupled to the output 532 of the AND-based logic gate 526, and an output 538 configured to provide the adaptive pulse signal 202. In this manner, the logic circuit 226 is configured to provide the adaptive pulse signal 202 having a pulse width corresponding to the input-to-output delay of the pulse latch 204 in response to an active transition of the clock signal CLK while the data input and data output-based signals 216, 218 are in different states.

Figure 6:
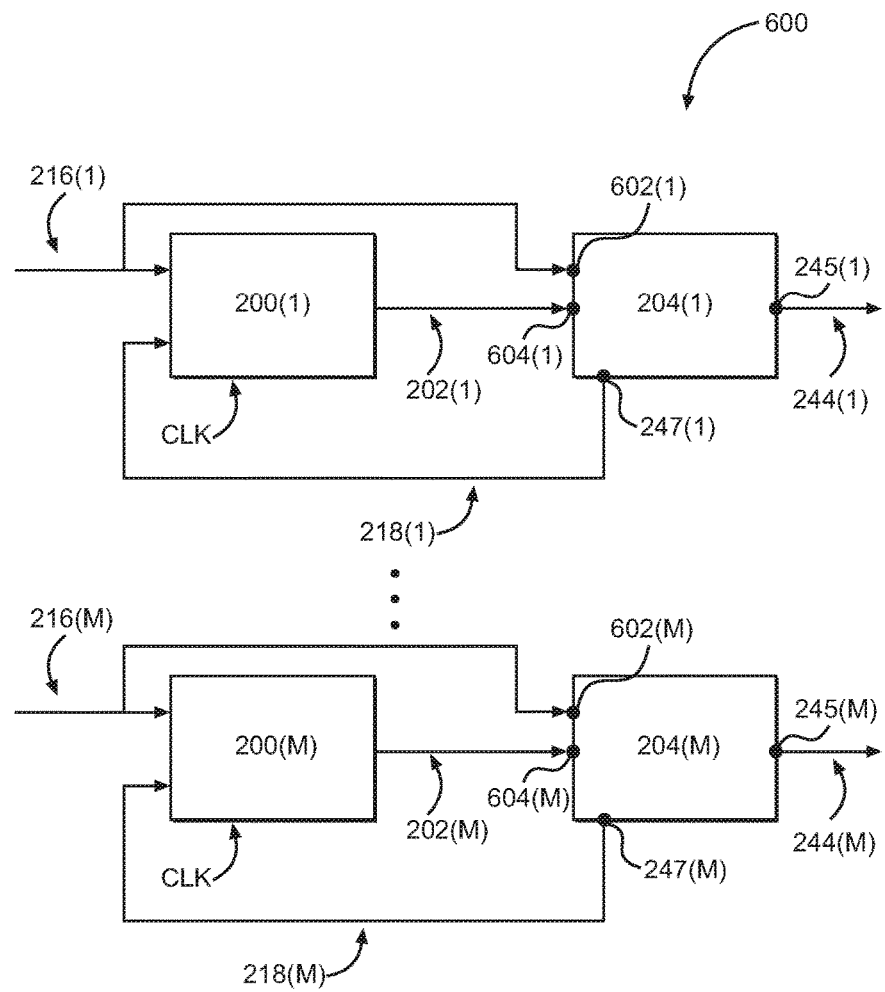
FIG. 6 is a block diagram of an exemplary digital logic circuit that employs a corresponding adaptive pulse generation circuit for each pulse latch.

As described above, the adaptive pulse generation circuits described herein are each configured to generate an adaptive pulse signal corresponding to a particular pulse latch so as to have a pulse width according to the PVT variations of the pulse latch. In this regard, FIG. 6 illustrates an exemplary digital logic circuit 600 that employs multiple adaptive pulse generation circuits 200(1)-200(M), each configured to clock a corresponding pulse latch 204(1)-204(M). Each pulse latch 204(1)-204(M) employs a data input 602(1)-602(M) configured to receive a corresponding data input signal 216(1)-216(M), and a pulse input 604(1)-604(M) configured to receive a corresponding adaptive pulse signal 202(1)-202(M). Additionally, each pulse latch 204(1)-204(M) employs a data pulse output 247(1)-247(M) configured to provide a data output-based signal 218(1)-218(M). Additionally, each pulse latch 204(1)-204(M) employs a data output 245(1)-245(M) configured to provide a data output signal 244(1)-244(M). Additionally, as described in relation to FIG. 2 above, each adaptive pulse generation circuit 200(1)-200(M) is configured to receive the clock signal CLK, the corresponding data input signal 216(1)-216(M), and the corresponding data output-based signal 218(1)-218(M), and provide the corresponding adaptive pulse signal 202(1)-202

(M). In this manner, each adaptive pulse generation circuit 200(1)-200(M) provides the adaptive pulse signal 202(1)-202(M) based on the current operating conditions of the corresponding pulse latch 204(1)-204(M) so as to minimize the corresponding hold time according to PVT variations particular to each pulse latch 204(1)-204(M).

The elements described herein are sometimes referred to as means for performing particular functions. In this regard, the dynamic XOR-based logic gate 208 is sometimes referred to herein as "a means for receiving a clock signal" and "a means for receiving a data input signal of the pulse latch." The dynamic XOR-based logic gate 208 is also sometimes referred to herein as "a means for receiving a data output-based signal of the pulse latch." The dynamic XOR-based logic gate 208 is also sometimes referred to herein as "a means for providing a pulse generation signal in an active state in response to the clock signal being in an inactive state." The dynamic XOR-based logic gate 208 is also sometimes referred to herein as "a means for providing the pulse generation signal in a state according to an XOR-based function of the data input signal and the data output-based signal in response to the clock signal being in an active state." The pull-down keeper circuit 224 is sometimes referred to herein as "a means for pulling the pulse generation signal to a ground voltage in response to the pulse generation signal being in an inactive state and the clock signal being in an active state." The logic circuit 226 is sometimes referred to herein as "a means for generating the adaptive pulse signal having a pulse width corresponding to an input-to-output delay of the pulse latch in response to the pulse generation signal and the clock signal being in an active state."

The adaptive pulse generation circuits for clocking pulse latches with minimum hold time according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 7:
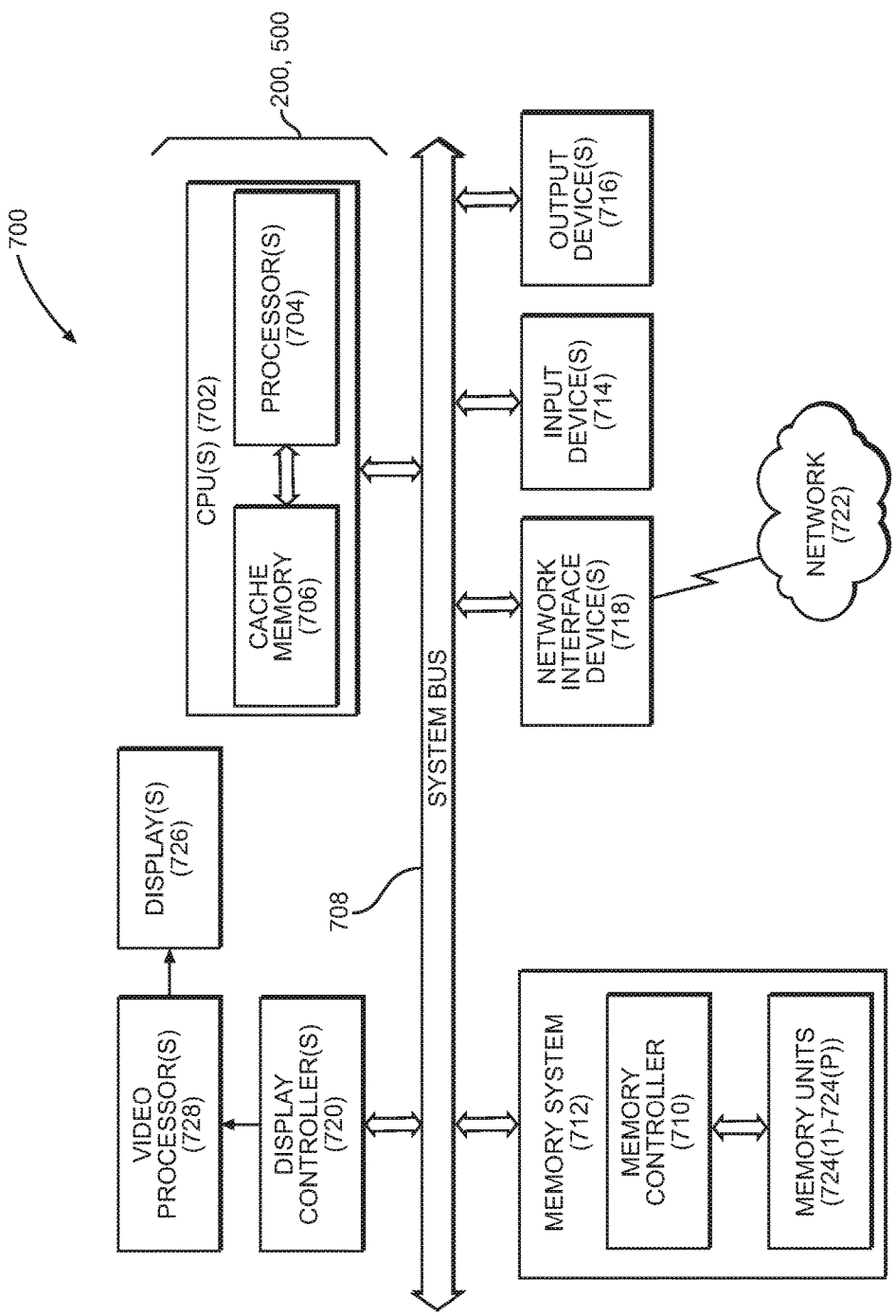
FIG. 7 is a block diagram of an exemplary processor-based system that can include the adaptive pulse generation circuits of FIGS. 2 and 5.

In this regard, FIG. 7 illustrates an exemplary processor-based system 700 that can employ the adaptive pulse generation circuits 200, 500 illustrated in FIGS. 2 and 5, respectively. In this example, the processor-based system 700 includes one or more central processing units (CPUs) 702, each including one or more processors 704. The CPU(s) 702 may have cache memory 706 coupled to the processor(s) 704 for rapid access to temporarily stored data. The CPU(s) 702 is coupled to a system bus 708 and can intercouple master and slave devices included in the processor-based system 700. As is well known, the CPU(s) 702 communicates with these other devices by exchanging address, control, and data information over the system bus 708. For example, the CPU(s) 702 can communicate bus transaction requests to a memory controller 710 as an example of a slave device. Although not illustrated in FIG. 7, multiple system buses 708 could be provided, wherein each system bus 708 constitutes a different fabric.

Other master and slave devices can be connected to the system bus 708. As illustrated in FIG. 7, these devices can include a memory system 712, one or more input devices 714, one or more output devices 716, one or more network interface devices 718, and one or more display controllers 720, as examples. The input device(s) 714 can include any type of input device, including, but not limited to, input keys, switches, voice processors, etc. The output device(s) 716 can include any type of output device, including, but not limited to, audio, video, other visual indicators, etc. The network interface device(s) 718 can be any device configured to allow exchange of data to and from a network 722. The network 722 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 718 can be configured to support any type of communications protocol desired. The memory system 712 can include one or more memory units 724(1)-724(P).

The CPU(s) 702 may also be configured to access the display controller(s) 720 over the system bus 708 to control information sent to one or more displays 726. The display controller(s) 720 sends information to the display(s) 726 to be displayed via one or more video processors 728, which process the information to be displayed into a format suitable for the display(s) 726. The display(s) 726 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An adaptive pulse generation circuit for generating an adaptive pulse signal for a pulse latch, comprising:
    a dynamic XOR-based logic gate, comprising:
        a clock input configured to receive a clock signal;
        a first input configured to receive a data input signal of the pulse latch;
        a second input configured to receive a data output-based signal of the pulse latch; and
        an output configured to:
            provide a pulse generation signal in an active state in response to the clock signal being in an inactive state; and
            provide the pulse generation signal in a state according to an XOR-based function of the data input signal and the data output-based signal in response to the clock signal being in an active state;
    a pull-down keeper circuit configured to pull the pulse generation signal to a ground voltage in response to the pulse generation signal being in an inactive state and the clock signal being in the active state; and
    a logic circuit configured to generate the adaptive pulse signal having a pulse width corresponding to an input-to-output delay of the pulse latch in response to the pulse generation signal and the clock signal being in the active state, wherein the logic circuit comprises:
        an AND-based logic gate, comprising:
            a first input configured to receive the clock signal;
            a second input electrically coupled to the output of the dynamic XOR-based logic gate; and
            an output configured to provide an inverted adaptive pulse signal; and
        an inverter, comprising:
            an input electrically coupled to the output of the AND-based logic gate; and
            an output configured to provide the adaptive pulse signal.

2. The adaptive pulse generation circuit of claim 1, wherein:
    the data output-based signal has a state that is the same as a state of a data output signal of the pulse latch;
    the data output signal is provided from a data output of the pulse latch; and
    the data output-based signal is provided from a data pulse output of the pulse latch different from the data output.

3. The adaptive pulse generation circuit of claim 1, wherein the output of the dynamic XOR-based logic gate is configured to provide the pulse generation signal in the active state by the dynamic XOR-based logic gate being configured to pre-charge the pulse generation signal to a source voltage in response to the clock signal being in the inactive state.

4. The adaptive pulse generation circuit of claim 1, wherein the dynamic XOR-based logic gate further comprises:
    a first P-type metal oxide semiconductor (MOS) (PMOS) transistor, comprising:
        a source electrically coupled to a supply voltage source;
        a gate electrically coupled to the clock input; and
        a drain electrically coupled to the output of the dynamic XOR-based logic gate;
    a first N-type MOS (NMOS) transistor, comprising:
        a source electrically coupled to a ground voltage source;
        a gate electrically coupled to the clock input; and
        a drain;
    a second NMOS transistor, comprising:
        a source electrically coupled to the drain of the first NMOS transistor;
        a gate electrically coupled to the first input of the dynamic XOR-based logic gate; and
        a drain; and
    a third NMOS transistor, comprising:
        a source electrically coupled to the drain of the second NMOS transistor;
        a gate electrically coupled to the second input of the dynamic XOR-based logic gate; and
        a drain electrically coupled to the output of the dynamic XOR-based logic gate.

5. The adaptive pulse generation circuit of claim 4, wherein the dynamic XOR-based logic gate further comprises:

a fourth NMOS transistor, comprising:
  a source electrically coupled to the drain of the first NMOS transistor;
  a gate configured to receive an inverted data input signal comprising a logical inverse of the data input signal; and
  a drain; and
a fifth NMOS transistor, comprising:
  a source electrically coupled to the drain of the fourth NMOS transistor;
  a gate configured to receive an inverted data output-based signal comprising a logical inverse of the data output-based signal; and
  a drain electrically coupled to the output of the dynamic XOR-based logic gate.

6. The adaptive pulse generation circuit of claim 4, wherein the pull-down keeper circuit comprises:
  an NMOS transistor, comprising:
    a source electrically coupled to the drain of the first NMOS transistor in the dynamic XOR-based logic gate;
    a gate; and
    a drain electrically coupled to the output of the dynamic XOR-based logic gate; and
  an inverter, comprising:
    an input electrically coupled to the output of the dynamic XOR-based logic gate; and
    an output electrically coupled to the gate of the NMOS transistor of the pull-down keeper circuit.

7. The adaptive pulse generation circuit of claim 1 integrated into an integrated circuit (IC).

8. The adaptive pulse generation circuit of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

9. An adaptive pulse generation circuit for generating an adaptive pulse signal for a pulse latch, comprising:
  a means for receiving a clock signal;
  a means for receiving a data input signal of the pulse latch;
  a means for receiving a data output-based signal of the pulse latch;
  a means for providing a pulse generation signal in an active state in response to the clock signal being in an inactive state;
  a means for providing the pulse generation signal in a state according to an XOR-based function of the data input signal and the data output-based signal in response to the clock signal being in an active state;
  a means for pulling the pulse generation signal to a ground voltage in response to the pulse generation signal being in an inactive state and the clock signal being in the active state; and
  a means for generating the adaptive pulse signal having a pulse width corresponding to an input-to-output delay of the pulse latch in response to the pulse generation signal and the clock signal being in the active state,
wherein the means for generating the adaptive pulse signal comprises:
  a means for generating an inverted adaptive pulse signal by performing a NAND-based logic function on the clock signal and the pulse generation signal; and
  a means for inverting the inverted adaptive pulse signal to generate the adaptive pulse signal.

10. The adaptive pulse generation circuit of claim 9, wherein the means for providing the pulse generation signal in the active state comprises a means for pre-charging the pulse generation signal to a source voltage in response to the clock signal being in the inactive state.

11. A digital logic circuit, comprising:
  a plurality of pulse latches, wherein each pulse latch of the plurality of pulse latches comprises:
    a data input configured to receive a data input signal;
    a pulse input configured to receive a corresponding adaptive pulse signal; and
    a data pulse output configured to provide a data output-based signal; and
  a plurality of adaptive pulse generation circuits, wherein each adaptive pulse generation circuit of the plurality of adaptive pulse generation circuits corresponds to a pulse latch of the plurality of pulse latches and comprises:
    a dynamic XOR-based logic gate, comprising:
      a clock input configured to receive a clock signal;
      a first input configured to receive the data input signal of the corresponding pulse latch;
      a second input configured to receive the data output-based signal of the corresponding pulse latch; and
      an output configured to:
        provide a pulse generation signal in an active state in response to the clock signal being in an inactive state; and
        provide the pulse generation signal in a state according to an XOR-based function of the data input signal and the data output-based signal in response to the clock signal being in an active state;
    a pull-down keeper circuit configured to pull the pulse generation signal to a ground voltage in response to the pulse generation signal being in an inactive state and the clock signal being in the active state; and
    a logic circuit configured to generate the corresponding adaptive pulse signal having a pulse width corresponding to an input-to-output delay of the corresponding pulse latch in response to the pulse generation signal and the clock signal being in the active state
  wherein each adaptive pulse generation circuit comprises:
    an AND-based logic gate, comprising:
      a first input configured to receive the clock signal;
      a second input electrically coupled to the output of the dynamic XOR-based logic gate; and
      an output configured to provide an inverted adaptive pulse signal; and
    an inverter, comprising:
      an input electrically coupled to the output of the AND-based logic gate; and
      an output configured to provide the corresponding adaptive pulse signal.

12. The digital logic circuit of claim 11, wherein:
the data output-based signal of each pulse latch of the plurality of pulse latches has a state that is the same as a state of a data output signal of the corresponding pulse latch;
the data output signal is provided from a data output of the corresponding pulse latch; and
the data output-based signal is provided from the data pulse output of the corresponding pulse latch different from the data output.

13. The digital logic circuit of claim 11, wherein the output of the dynamic XOR-based logic gate of each adaptive pulse generation circuit is configured to provide the pulse generation signal in the active state by being configured to pre-charge the pulse generation signal to a source voltage in response to the clock signal being in the inactive state.

14. The digital logic circuit of claim 11, wherein the dynamic XOR-based logic gate of each adaptive pulse generation circuit further comprises:
a first P-type metal oxide semiconductor (MOS) (PMOS) transistor, comprising:
a source electrically coupled to a supply voltage source;
a gate electrically coupled to the clock input; and
a drain electrically coupled to the output of the dynamic XOR-based logic gate;
a first N-type MOS (NMOS) transistor, comprising:
a source electrically coupled to a ground voltage source;
a gate electrically coupled to the clock input; and
a drain;
a second NMOS transistor, comprising:
a source electrically coupled to the drain of the first NMOS transistor;
a gate electrically coupled to the first input of the dynamic XOR-based logic gate; and
a drain; and
a third NMOS transistor, comprising:
a source electrically coupled to the drain of the second NMOS transistor;
a gate electrically coupled to the second input of the dynamic XOR-based logic gate; and
a drain electrically coupled to the output of the dynamic XOR-based logic gate.

15. The digital logic circuit of claim 14, wherein the dynamic XOR-based logic gate of each adaptive pulse generation circuit further comprises:
a fourth NMOS transistor, comprising:
a source electrically coupled to the drain of the first NMOS transistor;
a gate configured to receive an inverted data input signal comprising a logical inverse of the data input signal; and
a drain; and
a fifth NMOS transistor, comprising:
a source electrically coupled to the drain of the fourth NMOS transistor;
a gate configured to receive an inverted data output-based signal comprising a logical inverse of the data output-based signal; and
a drain electrically coupled to the output of the dynamic XOR-based logic gate.

16. The digital logic circuit of claim 14, wherein the pull-down keeper circuit of each adaptive pulse generation circuit comprises:
an NMOS transistor, comprising:
a source electrically coupled to the drain of the first NMOS transistor in the dynamic XOR-based logic gate;
a gate; and
a drain electrically coupled to the output of the dynamic XOR-based logic gate; and
an inverter, comprising:
an input electrically coupled to the output of the dynamic XOR-based logic gate; and
an output electrically coupled to the gate of the NMOS transistor of the pull-down keeper circuit.

\* \* \* \* \*